(12) United States Patent
Mauder

(10) Patent No.: US 7,378,741 B2
(45) Date of Patent: May 27, 2008

(54) SEMICONDUCTOR COMPONENT AND CORRESPONDING FABRICATION/MOUNTING METHOD

(75) Inventor: Anton Mauder, Kolbermoor (DE)

(73) Assignee: Infineon Technologies AG, Munich (DE)

( * ) Notice: Subject to any disclaimer, the term of this patent is extended or adjusted under 35 U.S.C. 154(b) by 118 days.

(21) Appl. No.: 10/977,120

(22) Filed: Oct. 29, 2004

(65) Prior Publication Data

US 2005/0121795 A1 Jun. 9, 2005

(30) Foreign Application Priority Data

Oct. 31, 2003 (DE) ................ 103 51 028

(51) Int. Cl.
*H01L 23/48* (2006.01)
*H01L 23/52* (2006.01)
*H01L 29/40* (2006.01)

(52) U.S. Cl. ...................... 257/762; 257/758
(58) Field of Classification Search ............. None
See application file for complete search history.

(56) References Cited

U.S. PATENT DOCUMENTS

| | | | | |
|---|---|---|---|---|
| 5,275,958 A | | 1/1994 | Ishikawa | 438/462 |
| 5,300,461 A | * | 4/1994 | Ting | 438/460 |
| 5,668,409 A | * | 9/1997 | Gaul | 257/723 |
| 5,834,844 A | * | 11/1998 | Akagawa et al. | 257/734 |
| 5,856,705 A | * | 1/1999 | Ting | 257/758 |
| 6,611,050 B1 | * | 8/2003 | Ference et al. | 257/679 |
| 2002/0038890 A1 | * | 4/2002 | Ohuchi | 257/349 |
| 2002/0047210 A1 | | 4/2002 | Yamada et al. | 257/774 |
| 2002/0089043 A1 | | 7/2002 | Park et al. | 257/668 |
| 2002/0096760 A1 | | 7/2002 | Simelgor et al. | 257/723 |
| 2002/0115234 A1 | | 8/2002 | Siniaguine | 438/107 |

FOREIGN PATENT DOCUMENTS

| | | |
|---|---|---|
| DE | 43 01 408 C2 | 3/1995 |
| DE | 101 07 142 A1 | 11/2002 |
| JP | 2002231972 A | 8/2002 |
| WO | WO03/073505 A1 | 9/2003 |

* cited by examiner

*Primary Examiner*—Andy Huynh
*Assistant Examiner*—Hoang-Quan Ho
(74) *Attorney, Agent, or Firm*—Maginot Moore & Beck

(57) ABSTRACT

A semiconductor component (1) has a substrate (21) and a structure (22, 23) formed from semiconductor/insulator/conductor layers (24 to 26) on/in the substrate (21). Furthermore, there is an insulator layer (32) which covers the surface and at least parts of the side walls of the semiconductor component (1) but leaves clear part of the surface of the structure (22, 23). Furthermore, there is a conductor layer (33) which is applied to the insulator layer (32) and additionally covers that part of the surface region of the structure (22, 23) which has been left clear by the insulator layer (32).

17 Claims, 3 Drawing Sheets

PRIOR ART

SEMICONDUCTOR COMPONENT AND CORRESPONDING FABRICATION/MOUNTING METHOD

BACKGROUND

The invention relates to a semiconductor component and to a corresponding fabrication/mounting method.

Power semiconductor components are only provided with a small number of pins (generally two to three) compared to IC components. The useability of a component of this type is greatly dependent on how efficiently the heat loss generated in the semiconductor component can be dissipated to the outside. This is because if the heat loss cannot be dissipated sufficiently quickly via the small number of pins, in the most serious scenario the semiconductor component can be destroyed. With surface-mounted semiconductor components, this problem can be counteracted by placing the semiconductor component on a lead frame which is pressed around it and then for its part soldered to a printed circuit board. The heat loss generated in the semiconductor component can then be efficiently dissipated via the lead frame and the soldering contact formed between lead frame and printed circuit board. A further problem with semiconductor components of this type resides in the punctiform connection locations for the load current. These are usually connected to the pins of the housing which surrounds the semiconductor component or lead frame by bonding wires and on the one hand limit the current-carrying capacity and homogeneity of the current distribution on the semiconductor component and on the other hand lead to additional, undesirable leakage inductances. The punctiform connection locations can even become the limiting variable in the semiconductor component with regard to the application of load current to the semiconductor component under surge current or overload conditions.

The abovementioned problems arise in particular with standard housings (for example TO-263 or D-Pak). Furthermore, the costs of these housings and corresponding processes for mounting the semiconductor components in the housings represent cost factors which are by no means negligible. SMD housings or axial housings which do not have a cooling connection that can be soldered to the printed circuit board in turn have the drawback that the heat loss which is generated cannot be dissipated quickly enough, since this can only be achieved via the small connection legs of the housings. Moreover, axial housings can only be arranged on the front surface of a printed circuit board, which greatly restricts the flexibility of the mounting arrangements.

Figure 1:
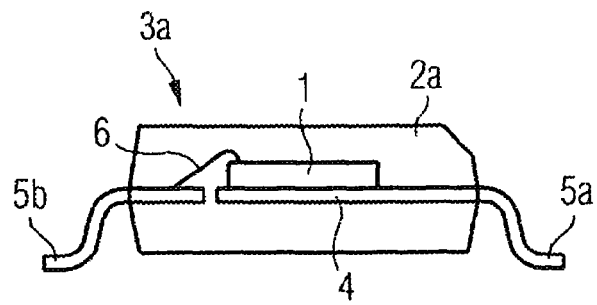
Figure 1:
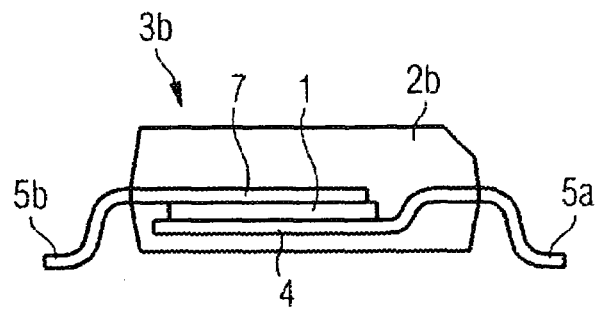
Figure 1:
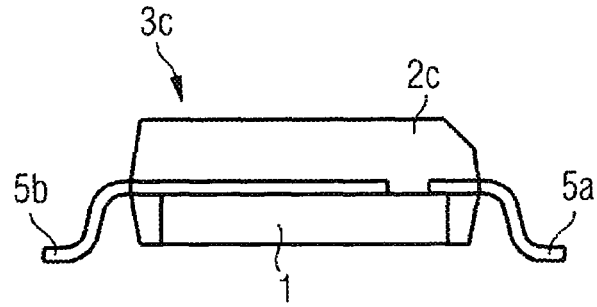
Figure 1:
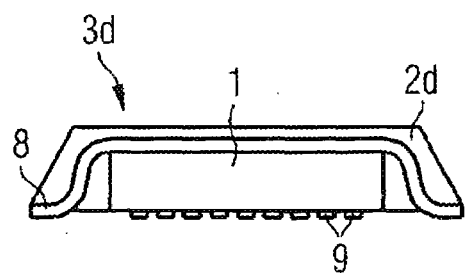
Figure 1:
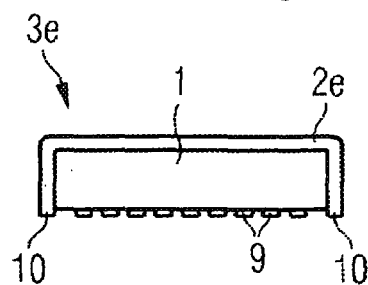

The problems which have been outlined above are to be explained further in the text which follows on the basis of specific examples and with reference to FIG. 1. FIG. 1 shows a semiconductor component 1 which is mounted in various housings (a first to fifth housing 2a to 2e). In a first embodiment 3a, the semiconductor component 1 is contact-connected both on its top side and on its underside, the underside of the semiconductor component 1 bearing directly on a contact layer 4, an extension of which leads out of the first housing 2a as first connection leg 5a. The top side of the semiconductor component 1 is connected via a bonding wire 6 to a contact-connection region, an extension of which leads out of the first housing 2a as second connection leg 5b. In the second embodiment 3b, the top side of the semiconductor component 1 is contact-connected by means of a contact layer 7 which forms an extension of the second connection leg 5b. In the third embodiment 3c, the semiconductor component 1 is contact-connected exclusively at its top side, i.e. the contact layers connected to the first and second connection legs 5a, 5b are both positioned on the top side of the semiconductor component 1, whereas the back surface can be soldered to the printed circuit board directly rather than via a connection leg during subsequent mounting.

In the fourth embodiment 3d, the top side of the semiconductor component 1 is contact-connected by a metal structure 8 which simultaneously represents the top side of the fourth housing 2d. The underside of the semiconductor component 1 can be soldered directly to a printed circuit board via corresponding contacts 9 which lead out of the fourth housing 2d. In the fifth embodiment 3e, the top side of the fifth housing 2e is "nestled" directly against the semiconductor component 1 and, as in the previous exemplary embodiment, serves for contact-connection of the top side of the semiconductor component 1, it being possible for the underside of the semiconductor component 1 to be soldered to a printed circuit board via contacts 9 together with the ends 10 of the top side of the housing 2e.

All the embodiments 3a to 3e described above have the drawback that mounting the semiconductor component is a relatively complex operation. Furthermore, the costs of the housings 2a to 2e are high. Also, at least in the first to third embodiments 3 to 3c, it is difficult for the heat loss generated in the semiconductor component 1 to be dissipated via the first and second connection legs 5a and 5b.

The object on which the invention is based is to provide a semiconductor component and a method for fabricating/mounting it which avoids the drawbacks described above.

To achieve this object, the invention provides a method for fabricating/mounting semiconductor components as described in patent claim 1. Furthermore, the invention provides a semiconductor component as described in patent claim 14. Advantageous embodiments and refinements of the subject matter of the invention are given in the subclaims.

SUMMARY

The conductor layer consists, for example, of a metal, a silicide or of polysilicon. The insulator layer is required in order to prevent electrical short circuits between the different signals or potentials on the semiconductor component.

The method according to the invention has the advantage that there is no need for semiconductor component mounting, since the insulator layer or conductor layer applied to the semiconductor component already provides sufficient protection for the semiconductor component from mechanical influences. The direct soldering of the semiconductor component onto the printed circuit board, moreover, effectively dissipates the heat loss which is generated in the semiconductor component. Furthermore, the conductor layer applied to the semiconductor component serves as a thermal capacitance which further reduces the dynamic thermal resistance to the dissipation of the heat loss in particular in pulsed operation. Furthermore, this conductor layer can also be used for contact-connection of the semiconductor component, so that the connection of contact-connection regions of the semiconductor component to housing terminals by means of bonding wires can be dispensed with. A further advantage is that the current-carrying capacity or homogeneity of the current distribution on the semiconductor component is improved if large parts or all of the area of the surfaces of the semiconductor components are covered by the conductor layer.

According to the invention, therefore, fabrication method and mounting method of the semiconductor component are combined with one another to form a single layer-production method. Additional, patterned or unpatterned conductor layers/insulator layers can be applied to the conductor layer, each of the additional conductor layers being electrically connected at least to parts of the uncovered surfaces of the semiconductor components. Each of these additional conductor layers can be extended out of the semiconductor component, thereby allowing complex wiring arrangements of the semiconductor component. The individual conductor layers may in this case be completely insulated from one another by the insulation layers and/or may be in contact with one another. The layer-production method according to the invention therefore makes it possible to fabricate a semiconductor component which on the top side is provided with a three-dimensional "printed-circuit board structure" via which different contacts or contact regions on the uncovered surfaces of the semiconductor components can be deliberately and individually contact-connected. Those ends of the respective conductor layers which extend outward then form corresponding external contacts.

It is preferable for at least one passivation layer to be applied to the conductor layers/insulator layers in order to further increase the mechanical stability of the semiconductor components that are to be fabricated and/or to electrically insulate the semiconductor component with respect to the outside and protect it from aggressive environmental influences. The thicknesses of the insulator layers and/or of the conductor layers and/or of the passivation layers may, for example, be selected in such a way that the mechanical stability produced by these layers corresponds to that of a semiconductor component housing or eliminates the need for such a housing. The thicknesses of the insulator layers are preferably selected in such a way that they are at least sufficient to insulate electrical voltages corresponding to the highest reverse voltage of the semiconductor component. The thicknesses of the conductor layers are preferably selected to be such that sufficient dissipation of power loss produced is ensured and there is a sufficient conductor cross section for the current-carrying capacity of the semiconductor component. This means that the mechanical stability, insulation properties and the dissipation of power loss which is generated can be controlled by a suitable selection of the layer thicknesses.

A back-surface contact may then be formed on the back surface of the thinned substrate, for example in the form of a solderable or adhesively bondable metal layer and/or by the application of solder material.

It is preferable for the substrate to be thinned as far as the base of the trenches. If it is thinned to this extent, after dicing of the individual components along the trenches the insulator layers and/or the conductor layers run horizontally outward at their respective ends. This firstly allows problem-free contact-connection of the respective conductor layers from the side and secondly means that after the thinning operation it is possible for an adhesive or a layer of adhesive to be applied to the underside of the horizontally running ends of the bottom insulator layer. The application of a layer of adhesive of this type has the advantage that it is possible to suppress leakage currents beneath the horizontally running parts of the bottom insulator layer, i.e. between this insulator layer and the printed circuit board.

Alternatively, the substrate can be thinned to a height which corresponds to a top side of the horizontal part, running in the trenches, of a conductor layer, in which case the horizontal parts, running in the trenches beneath this top side, of the insulator layers/conductor layers are removed by the thinning process or thereafter.

To further facilitate the contact-connection of the ends which are "extended outward" of the conductor layers, it is possible for the horizontal dimensions of the passivation layers and/or insulator layers of each component to be reduced by means of etching processes or mechanical treatment after the dicing operation, so that the horizontally running end part of at least one conductor layer projects out of the insulator layers/passivation layers. If the material is etched back as far as the vertical part, running on the side walls, of a conductor layer, a large contact-connection surface area is made available (the entire part of the side wall of the semiconductor component which is covered with this conductor layer).

The conductor layers are produced, for example, by copper electroplating. It is in principle possible to use any desired materials. To prevent the conductor from being oxidized, the conductor can then be "sealed" (for example by tin plating or the like). The conductor layers can also be produced by means of a plurality of successive deposition processes each using different deposition materials. This results in conductor layers which each contain a plurality of conductor materials.

The semiconductor component according to the invention which is fabricated by the method described above includes: a substrate, a structure formed on/in the substrate from semiconductor/insulator/conductor layers, and an insulator layer which covers the surface and at least parts of the side walls of the semiconductor component but leaves clear part of the surface of the structure. Furthermore, the semiconductor component has a conductor layer which is applied to the insulator layer and additionally covers that part of the surface region of the structure which has been left clear by the insulator layer. The conductor layer is preferably patterned.

As has already been mentioned, it is possible for additional, patterned or unpatterned conductor layers/insulator layers to be applied to the conductor layer, each of the additional conductor layers being electrically connected at least to parts of the uncovered surfaces of the semiconductor components.

It is preferable for at least one passivation layer to be applied to the conductor layers, the thicknesses of the insulator layers and/or the conductor layers and/or the passivation layers being selected to be such that the mechanical stability produced by these layers obviates the need for a semiconductor component housing to mechanically protect the semiconductor component.

It is preferable for a metal layer and/or solder material to be applied to the back surface of the substrate in order for the semiconductor component to be soldered onto a printed circuit board and/or electrically and thermally contact-connected to it.

That end of at least one insulator layer which is located on the substrate underside is preferably continued outward in the form of a horizontal extension of the underside of the substrate/semiconductor component. Similarly, that end of at least one conductor layer on or above the horizontal extension of the insulator layer which is located on the substrate underside is continued outward. The horizontal dimensions of the insulator layers, the conductor layers and the passivation layers applied thereto may in each case be identical. However, it is preferable for the horizontal dimensions of the insulator layers and passivation layers to be less than the horizontal dimensions of the conductor layers.

To avoid leakage currents and electrical sparkovers, it is possible for an adhesive or a layer of adhesive to be provided on an underside of the outward horizontal extension of the bottom insulator layer.

The conductor layers may comprise a plurality of conductor sublayers. It is preferable for the conductor layers to consist of electroplating copper.

BRIEF DECRIPTION OF THE DRAWINGS

The invention is explained in more detail below in the form of an exemplary embodiment and with reference to the accompanying figures, in which:

FIG. 1 shows various embodiments of a conventional housing in which a semiconductor component is mounted.

Figure 2:
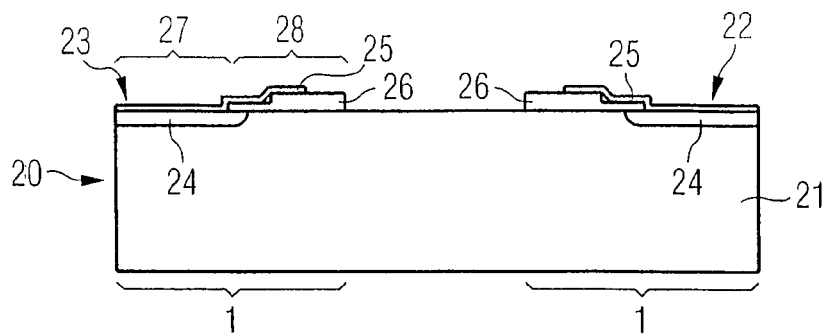

FIG. 2 diagrammatically depicts a first process state of the fabrication/mounting method according to the invention.

Figure 3:
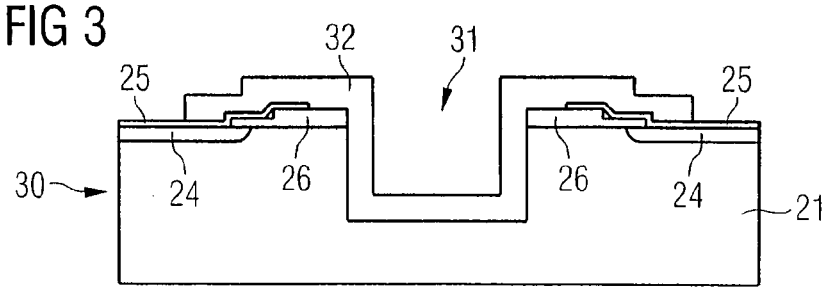

FIG. 3 diagrammatically depicts a second process state of the fabrication/mounting method according to the invention.

Figure 4:
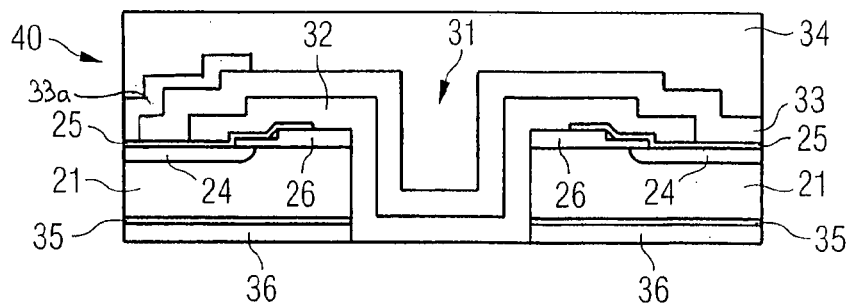

FIG. 4 diagrammatically depicts a third process state of the fabrication/mounting method according to the invention.

Figure 5:
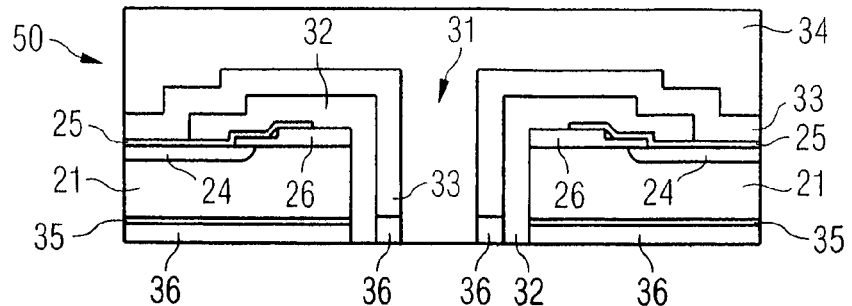

FIG. 5 diagrammatically depicts a fourth process state, which is an alternative to the third process state shown in FIG. 4, of the fabrication/mounting method according to the invention.

Figure 6:
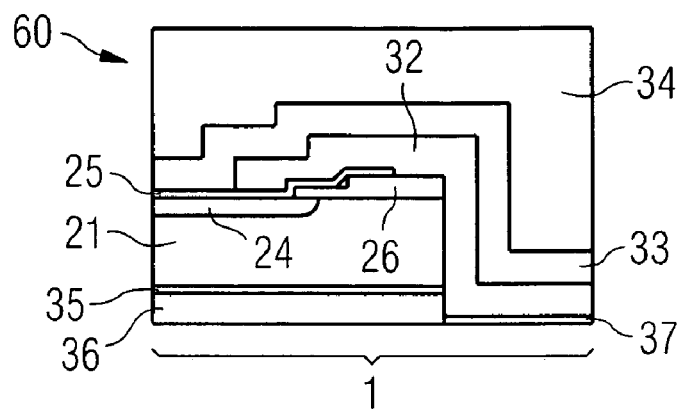

FIG. 6 diagrammatically depicts a fifth process state of the fabrication/mounting method according to the invention.

Figure 7:
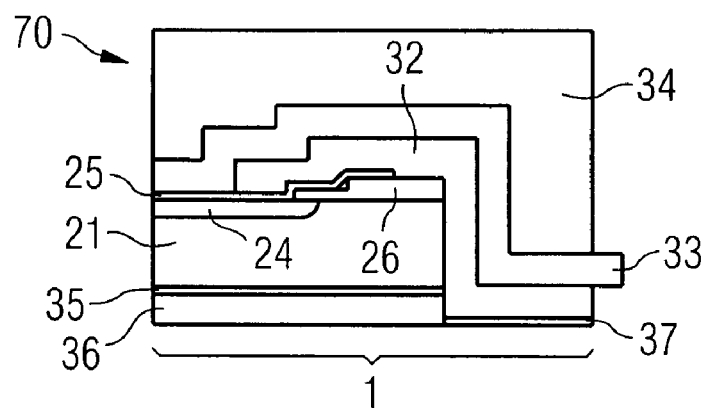

FIG. 7 diagrammatically depicts a sixth process state of the fabrication/mounting method according to the invention.

Figure 8:
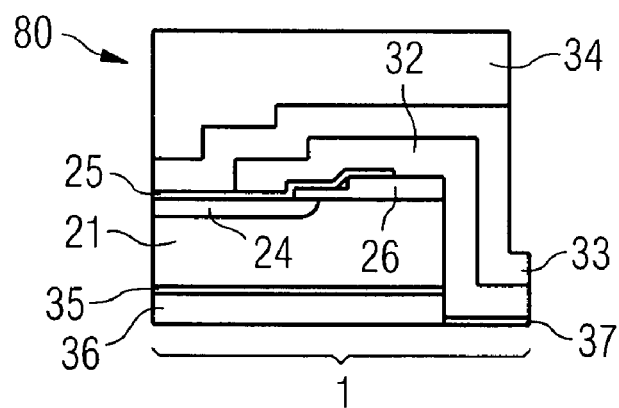

FIG. 8 diagrammatically depicts a seventh process state of the fabrication/mounting method according to the invention.

DESCRIPTION

In the figures, identical or corresponding components or component assemblies are denoted by the same reference numerals.

The following description is to provide a more detailed explanation of a preferred embodiment of the fabrication/mounting method according to the invention, with reference to FIGS. 2 to 8. FIGS. 2 to 8 show, by way of example, diode semiconductor components. However, the invention is not restricted to such components but rather can be applied to any desired semiconductor components.

FIG. 2 shows a first process state 20 of the fabrication/mounting method according to the invention. The figure illustrates part of a substrate 21, on/in which a plurality of structures have been formed from semiconductor/insulator/conductor layers. This example shows a first structure 22 and a second structure 23. Both the first structure 22 and the second structure 23 have a semiconductor layer 24, at least a first conductor layer 25 (for example made from metal) and at least one insulator layer 26. The semiconductor layer 24 (or at least part of it) forms an active area 27, whereas an edge termination 28 is substantially formed by the insulator layer 26 and the first conductor layer 25 applied to parts of it. On at least partial regions of the active area there may be conductive layers which are in electrical contact with at least one region of the active area. These conductor surfaces can also be at different electrical potentials as a result of patterning and/or the provision of at least one additional insulator layer.

In the first process state 20 shown in FIG. 2, the individual semiconductor components, which each comprise a structure (e.g. the first or second structure 22, 23) and that part of the substrate 21 which is located beneath the corresponding structure, are still connected to one another via the substrate 21 (the common wafer). Apart from any steps of processing the back surface which may not yet have been carried out, however, they are in principle already "functional". In the fabrication/mounting methods which have been disclosed hitherto, the individual semiconductor components (which in this embodiment are diodes) would be diced by sawing through the substrate 21, if appropriate after the steps of processing the back surface had been carried out, and then mounted in a suitable housing. By way of example, discrete semiconductors with a vertical flow of current require steps for processing the back surface, such as for example ion implantation or application of a metallization. According to the invention, the process steps described below avoid the need for mounting processes of this type.

According to the invention, trenches 31 are introduced into the substrate 21 between the structures (in this case between the first and second structures 22, 23), for example by an etching process. Each semiconductor component 1 is therefore completely surrounded by trenches 31. Then, an insulator layer 32 is applied over the entire wafer surface. The insulator layer 32 is patterned by means of a suitable process (for example by means of a lithography process) in such a way that part of the surface of each semiconductor component 1 is uncovered. The surface of the uncovered part should be at least partially formed by the first conductor layer 25. This results in the second process state 30 shown in FIG. 3. As can be seen from FIG. 3, the insulator layer covers the entire side walls of the trench 31 as well as its base.

Then, a second conductor layer 33 is applied over the entire wafer surface, accordingly covering the entire insulator layer 32 as well as the uncovered parts of the surfaces of the semiconductor components. An insulator or passivation layer 34 is applied to the second conductor layer 33. Then, the substrate 21 is thinned until the lower end of the substrate is at the same height as the underside of that part of the conductor layer 33 which runs horizontally in the trench 31. A contact layer 35 is formed on the back surface of the substrate 21, and solderable material and/or solder material 36 is in turn applied to the contact layer 35. This results in the third process state 40 shown in FIG. 4. As has already been mentioned, it is possible for additional, patterned or unpatterned conductor layers (e.g., layer 33a) to be applied to the conductor layer, each of the additional conductor layers being electrically connected at least to parts of the uncovered surfaces of the semiconductor components.

Alternatively, it is also possible for the substrate 21 to be thinned further, in which case, as shown in FIG. 5, it is possible for the horizontal parts of the insulator layer 32 or the conductor layer 33 running inside the trench 31 to be removed. In this embodiment, to enable the conductor layer 33 to be contact-connected to a printed circuit board, solderable material and/or solder material 36 should likewise be applied to the lower end of the conductor layer 33. This results in the fourth process state 50 shown in FIG. 5.

It is then possible for the semiconductor components 1 to be diced along the trenches 31. If such a dicing operation is carried out along the trench 31 shown in FIG. 4, the result is the fifth process state 60 shown in FIG. 6. It is advantageous for a layer of adhesive 37 to be applied to an underside of a horizontally running end of the insulator layer 32. To allow good contact-connection of the second conductor layer 33, it is possible to reduce the horizontal dimensions of the insulator or passivation layer 34 and of the insulator layer 32, for example by means of an etching process. This results in the sixth process state 70 shown in FIG. 7. As can be seen from FIG. 7, following this material-removing process, the end of the second conductor layer 33 projects out of the insulator or passivation layers 32, 34.

Alternatively, it is also possible for the material-removal process to continue until the entire vertically running part of the second conductor layer 33 is uncovered, as shown in FIG. 8. The embodiment 80 shown in FIG. 8 allows very simple contact-connection of the second conductor layer 33, since there is a large contact surface area.

The thicknesses of the insulator layer 32, the second conductor layer 33 and the passivation layer 34 should be selected in such a way that on the one hand sufficient mechanical stability is ensured and on the other hand sufficient protection from aggressive environmental influences for the semiconductor component 1 is ensured. The thickness of the insulator layer 32 should be sufficiently great for it to be suitable at least for insulating electric voltages corresponding to the highest reverse voltage of the semiconductor component 1, thereby making it possible to avoid electrical sparkovers. The thickness of the conductor layer 33, furthermore, should be selected in such a way that sufficient dissipation of power loss produced is ensured and there is a sufficient conductor cross section for the current-carrying capacity of the semiconductor component 1. Typical thickness ranges of the insulator layer 32 are from 3 to 100 μm, and typical thickness ranges for the passivation layer 34 are from one to several hundred μm. If a metal of good conductivity, such as for example copper or aluminum, is used for the second conductor layer 33, thickness ranges of the second conductor layer 33 are typically between 3 and 50 μm. In the case of materials with a poor electrical conductivity, it may be necessary for the conductor layer 33 to be made correspondingly thicker. The width of the trench 31 is typically from 50 to 150 μm. However, the invention is not restricted to these ranges.

The invention can also be presented as follows:

The present invention shows a particularly inexpensive solution, which is simple to integrate in the wafer process, in particular for a die sized package, and an optimized embodiment for high-voltage components.

The following steps and cross sections are shown for a diode, for the sake of simplicity, but can equally well apply to transistors (low-voltage, high-voltage, CooIMOS, IGBT or the like) and/or what are known as "smart" power semiconductors. The only difference is that the second conductor layer (for example a layer of metal) has to be patterned on the front surface.

The starting point is a conventional power semiconductor component with an active area and an edge termination. The first level of the front surface metallization can be made very thin compared to current products, since it primarily serves as an edge termination (e.g. for field plates) and/or to carry current only over a few μm or a few tens of μm at the edges of the active area.

At the start of the package process, the component should not yet have been thinned to its target thickness. Then, in a first step, a trench is introduced into the component; the depth of this trench should be at least equal to what will subsequently be the final thickness of the chip. The trench can be produced by etching, sawing or laser cutting or by a combination of these processes.

In a subsequent step, an insulator layer is applied and patterned. Fotoimide is particularly suitable for this layer, since it is itself photosensitive and at the same time has a high insulation strength.

The thickness of the insulator in this context advantageously depends on the reverse voltage of the chip (and if appropriate on a minimum layer thickness which is technologically feasible without holes). It is preferably approximately 3 μm per kV of locking capacity, but may also be thicker to provide a greater process reliability.

Then, in the next step, a second conductor layer is applied. For transistors, this layer should have been patterned or at least should be patterned at a later stage. The thickness of the layer is significantly greater than that of the first metallization level, in order to minimize bulk resistances. The deposition of a metal layer by electroplating is particularly suitable as second conductor layer. To improve the bonding to the bases and/or to protect against corrosion, this metal layer may also comprise a sequence of different metals. Then, a further insulator layer is applied over the entire surface of this (optionally patterned) second conductor layer. Since this layer is also intended to offer mechanical protection for the component, its thickness should expediently not be made too thin.

To avoid high reverse currents when illuminating the components in operation, each part of the chip should be covered either with metal or an opaque insulator. On the other hand, processing and alignment of the wafer is facilitated if the top insulator layer is at least slightly translucent. Therefore, it is expedient for the lower insulator layer (e.g. fotoimide) to be made completely opaque.

Finally, the chip is thinned to its target thickness and, by way of example, ion implantations for a resistive back-surface contact or a back-surface emitter are introduced. Since the layers only allow chip temperatures of up to approximately 400° C. on the front surface, stronger activation of these back-surface implantations can only be achieved, for example, using laser annealing processes that are known per se. The solderable and adhesively bondable back-surface metallization for the chip is applied in patterned form or is patterned at a later stage. Alternatively, it is also possible for the back-surface metallization to be applied directly as a solder deposit which melts as a result of the soldering process carried out by the customer so as to produce the connection between the component and the printed circuit board.

The chips may be diced by sawing, laser cutting and the like even before they are measured.

In the case of high-voltage components, the distance between the electrical potentials on the front surface and the back surface of the chip is particularly critical. Both during component measurement and during subsequent mounting by the customer, an insufficient distance will lead to an electrical sparkover or increased leakage currents in the case of low-voltage component failure. However, leakage currents caused by contamination can also lead to faults even in low-voltage components.

Therefore, a modification to the invention provides for the front surface metal to extend outward above the first insulator layer.

After dicing of the chips, the front surface metal ends at the side faces a few μm above the lower chip boundary. If necessary, the upper insulator layer or even both insulator layers can be etched back a few μm, for example by means of a plasma etch, or the covering insulator and the second conductor layer (metallization) can be separated using two different widths of cut to enable the connection to project out of the side wall slightly. This makes it possible to facilitate wetting during soldering by the customer and also to optically inspect the wetting.

For this housing variant, it is expedient for the interconnects on the front surface to be formed using a metal which can be soldered using standard soft solders (e.g. copper (Cu)). Also, the surface of both the back-surface metallization and also of (at least the uncovered parts) of the second front-surface metallization should be provided with a covering or layer system which, at its surface, consists, for example, of Sn or a precious metal/precious metal alloy, in order to ensure the subsequent wetting and solderability. This coating of the surfaces to be wetted can be carried out in a common electroplating process.

With conventional thicknesses of the soft solder pastes of in some cases well over 50 µm, it is not critical for the wetting of the metallization stump during customer mounting if there is a distance of from 3 . . . 30 µm between front-surface metallization and the underside of the chip.

The underside of the first insulator layer (e.g. of the fotoimide) may be provided with an adhesive layer, which fixes the component in place before it is soldered onto the customer's circuit, outside the back-surface metallization. This adhesive layer can also be used to ready-attach the component to a film or foil strip on which it is supplied, which considerably simplifies packaging of the component on reels. This adhesive has to be able to withstand the soldering temperature used during the soldering process without becoming detached from the printed circuit board surface or the soldering stop resist and the lower insulating layer. Suitable adhesive materials are based, for example, on silicones.

As an alternative to a self-adhesive boundary surface, this plastic layer may also be solid at standard operating temperatures of up to, for example, 200° C. but melt at the soldering temperatures. This results in a tight join to the printed-circuit board surface (soldering stop resist) which remains strong and advantageously permanently elastic after it has cooled.

The background to both considerations is that the underside of the component is completely sealed between the back-surface potential and the front-surface potentials after mounting. This means that the only distance required is the distance of the corresponding dielectric strength of the insulator (adhesive), rather than the long leakage path in air. This greatly reduces the space required on the circuit to which the semiconductor component is soldered, in particular in the case of multilayer printed circuit boards. Moreover, the space taken up by each chip on the wafer is reduced in the same way.

If the trench structure is already required for the edge termination, the thickness of the first insulator layer should not be too low (e.g. between 10 and 30 µm depending on the voltage class), since otherwise the potential distribution in the semiconductor is excessively affected on account of the field plate effect of the second metallization layer on the perpendicular chip edge.

As has become clear in the preceding description, the invention provides a component with chip sized package and contact-connection form in a single level, with the front-surface connections routed onto the back surface by a connection produced from a single material which is applied in one step.

LIST OF REFERENCE SYMBOLS

1 Semiconductor component
2a-2e First to fifth housing
3a-3e First to fifth embodiment
4 Contact layer
5a First connection leg
5b Second connection leg
6 Bonding wire
7 Contact layer
8 Metal structure
9 Contacts
10 Ends of the housing top side
20 First process state
21 Substrate
22 First structure
23 Second structure
24 Semiconductor layer
25 First conductor layer
26 Insulator layer
27 Active area
28 Edge termination
31 Trench
30 Second process state
32 Insulator layer
33 Second conductor layer
34 Insulator or passivation layer
35 Contact layer
26 Solder material
37 Layer of adhesive
40 Third process state
50 Fourth process state
60 Fifth process state
70 Sixth process state

The invention claimed is:

1. A semiconductor component comprising:
   a substrate defining a component sidewall and a component underside;
   a semiconductor layer, a first insulator layer, and a first conductor layer provided on the substrate and defining an upper component surface;
   a second insulator layer covering a first portion of the upper component surface and the component sidewall wherein the second insulator layer does not cover a second portion of the upper component surface, and wherein the second insulator extends down the component sidewall to the component underside and forms a horizontal extension of the component underside;
   a second conductor layer applied to the second insulator layer and cover the second portion of the upper component surface; and
   a passivation layer applied to the second conductor layer; wherein the horizontal dimensions of the second insulator layer, the second conductor layer and the passivation layer are substantially identical.

2. The semiconductor component as claimed in claim 1 wherein the second conductor layer is patterned.

3. The semiconductor component as claimed in claim 1 wherein an additional conductor layer is applied to the second conductor layer, the additional conductor layer being electrically connected to the second portion of upper component surface.

4. The semiconductor component as claimed in claim 1 wherein the thicknesses of the second insulator layer, the second conductor layer, and the passivation layer are such that a mechanical stability produced by the second insulator layer, the second conductor layer and the passivation layer obviates the need for a semiconductor component housing.

5. The semiconductor component as claimed in claim 1 wherein a metal layer or solder material is applied to at least part of the component underside.

6. The semiconductor component as claimed in claim 1 wherein an adhesive layer is provided on an underside of the horizontal extension of the component underside.

7. The semiconductor component as claimed in claim 1 wherein the second conductor layer comprises a plurality of conductor sublayers.

8. The semiconductor component as claimed in claim 1 wherein the second conductor layer comprises electroplated copper.

9. A semiconductor component comprising:
- a substrate defining a component sidewall and a component underside;
- a semiconductor layer, a first insulator layer, and a first conductor layer provided on the substrate and defining an upper component surface;
- a second insulator layer covering a first portion of the upper component surface and the component sidewall wherein the second insulator layer does not cover a second portion of the upper component surface, and wherein the second insulator extends down the component sidewall to the component underside and forms a horizontal extension of the component underside;
- a second conductor layer applied to the second insulator layer and cover the second portion of the upper component surface;
- a passivation layer which is applied to the second conductor layer; and
- wherein the horizontal dimensions of the second conductor layer are greater than the horizontal dimensions of the second insulator layer and the passivation layer.

10. The semiconductor component as claimed in claim 9 wherein a horizontally extending end of the second conductor layer extends past the horizontal extension of the component underside formed by the second insulation layer.

11. The semiconductor component as claimed in claim 9 wherein the second conductor layer comprises a plurality of conductor sublayers.

12. The semiconductor component as claimed in claim 9 wherein the second conductor layer comprises electroplated copper.

13. The semiconductor component as claimed in claim 9 wherein the second conductor layer is patterned.

14. The semiconductor component as claimed in claim 9 wherein an additional conductor layer is applied to the second conductor layer, the additional conductor layer being electrically connected to the second portion of upper component surface.

15. The semiconductor component as claimed in claim 9 wherein the thicknesses of the second insulator layer, the second conductor layer, and the passivation layer are such that a mechanical stability produced by the second insulator layer, the second conductor layer and the passivation layer obviates the need for a semiconductor component housing.

16. The semiconductor component as claimed in claim 9 wherein a metal layer or solder material is applied to at least part of the component underside.

17. The semiconductor component as claimed in claim 9 wherein an adhesive layer is provided on an underside of the horizontal extension of the component underside.

* * * * *